(12) United States Patent
Liu et al.

(10) Patent No.: US 10,625,311 B2
(45) Date of Patent: Apr. 21, 2020

(54) CACHE DEVICE AND LCD SCREEN PRODUCTION LINE

(71) Applicants: BOE TECHNOLOGY GROUP CO., LTD., Beijing (CN); HEFEI XINSHENG OPTOELECTRONICS TECHNOLOGY CO., LTD., Hefei (CN)

(72) Inventors: Chao Liu, Beijing (CN); Qingshuang Ren, Beijing (CN); Erfeng Shen, Beijing (CN); Tae Hyuck Yoon, Beijing (CN); Aihua Lei, Beijing (CN); Han Yan, Beijing (CN); Xingming Hu, Beijing (CN); Rubao Bi, Beijing (CN); Chaomou Dai, Beijing (CN); Shengwang Dong, Beijing (CN); Xiaofu Wu, Beijing (CN); Weiwei Zhou, Beijing (CN); Dongdong Zhang, Beijing (CN); Jinming Li, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

( * ) Notice: Subject to any disclaimer, the term of this patent is extended or adjusted under 35 U.S.C. 154(b) by 265 days.

(21) Appl. No.: 15/761,006

(22) PCT Filed: Aug. 24, 2017

(86) PCT No.: PCT/CN2017/098817
§ 371 (c)(1),
(2) Date: Mar. 16, 2018

(87) PCT Pub. No.: WO2018/153041
PCT Pub. Date: Aug. 31, 2018

(65) Prior Publication Data
US 2019/0030575 A1    Jan. 31, 2019

(30) Foreign Application Priority Data

Feb. 21, 2017    (CN) .......................... 2017 1 0093304

(51) Int. Cl.
*B08B 5/02*    (2006.01)
*H01L 21/673*    (2006.01)
(Continued)

(52) U.S. Cl.
CPC ................. *B08B 5/02* (2013.01); *B65G 1/02* (2013.01); *G02F 1/1303* (2013.01);
(Continued)

(58) Field of Classification Search
CPC ....... B08B 5/02; B08B 9/08; H01L 21/67363; H01L 21/67393; G02F 1/1303;
(Continued)

(56) References Cited

U.S. PATENT DOCUMENTS

| 5,303,482 A | 4/1994 | Yamashita et al. |
| 2008/0069672 A1 | 3/2008 | Ikehata |
| 2019/0206708 A1* | 7/2019 | Woo .................. H01L 21/02041 |

FOREIGN PATENT DOCUMENTS

| CN | 2923597 Y | 7/2007 |
| CN | 101143644 A | 3/2008 |

(Continued)

OTHER PUBLICATIONS

International Search Report from PCT Application No. PCT/CN2017/098817 dated Nov. 30, 2017 (5 pages).
(Continued)

*Primary Examiner* — David Redding
(74) *Attorney, Agent, or Firm* — Dave Law Group, LLC; Raj S. Dave

(57) ABSTRACT

The present disclosure provides a cache device and a LCD screen production line. The cache device provided by the
(Continued)

present disclosure includes an outer frame having an opening for picking and placing cached items on a first side wall thereof and a support bracket for horizontally supporting cached items therein; and first blowing means disposed on the second side wall of the outer frame for blowing air toward the opening; second blowing means disposed on the third side wall or the fourth side wall of the outer frame; an exhaust means disposed on a fourth side wall opposite to the third side wall of the frame.

10 Claims, 2 Drawing Sheets

(51) Int. Cl.
  *B65G 1/02* (2006.01)
  *G02F 1/13* (2006.01)
  *B08B 9/08* (2006.01)
  *A47L 5/38* (2006.01)

(52) U.S. Cl.
  CPC .. *H01L 21/67363* (2013.01); *H01L 21/67393* (2013.01); *B08B 9/08* (2013.01)

(58) Field of Classification Search
  CPC . G02F 2001/1316; G02F 1/1313; B65G 1/02; A47L 5/38
  USPC .......................................................... 15/301
  See application file for complete search history.

(56) References Cited

FOREIGN PATENT DOCUMENTS

| | | |
|---|---|---|
| CN | 101844661 A | 9/2010 |
| CN | 102452554 A | 5/2012 |
| JP | 2002299427 A | 10/2002 |
| JP | 200455814 A | 2/2004 |

OTHER PUBLICATIONS

Written Opinion from PCT Application No. PCT/CN2017/098817 dated Nov. 30, 2017 (5 pages).
Office Action from Chinese Application No. 201710093304.0 dated Jul. 23, 2019 (6 pages).

* cited by examiner

CACHE DEVICE AND LCD SCREEN PRODUCTION LINE

CROSS REFERENCE TO RELATED APPLICATIONS

This application claims the priority of Chinese Patent Application No. 201710093304.0 filed on Feb. 21, 2017, the entire contents of which are hereby incorporated by reference as part of this application.

TECHNICAL FIELD

This disclosure relates to the field of cache apparatus, and particularly, to a cache device and a liquid crystal display (LCD) screen production line.

BACKGROUND

Cache devices are widely used in electronic glass (e.g., LCD screen) deep-processing production lines for storing glass substrates.

SUMMARY OF THE INVENTION

The present disclosure is intended to provide a cache device.

A cache device provided in one embodiment of the present disclosure includes:

a frame, a first side wall of which has an opening for picking and placing cached items;

a support bracket located in an area surrounded by the frame for supporting the cached items;

first blowing means on a second side wall opposite to the first side wall of the frame; the first blowing means being configured to blow air toward the opening;

second blowing means on a third side wall of the frame adjacent to the first side wall; and exhaust means disposed on a fourth side wall opposite to the third side wall of the frame.

Further, the cache device also comprises: third blowing means disposed on a fifth side wall of the frame; and at least one vent disposed on a sixth side wall opposite to the fifth side wall.

Further, the second blowing means is configured to blow an air stream at a pressure not less than the pressure of the air stream blown by the first air blowing means, and/or the third blowing means is configured to blow an air steam at a pressure not less than the pressure of the air stream blown by the second blowing means.

Further, the fourth sidewall comprises a vertical guide plate in which at least one guide hole is arranged. Further, the first blowing means includes a plurality of EFUs, which are arranged in a rectangular array; and/or the second blowing means and the third blowing means include, respectively, a plurality of nozzles in communication with a source of compressed dry air; and/or the exhaust means is vacuum exhaust means.

Further, the nozzle is a 360° rotating nozzle.

Further, the cache device also includes detecting means and a controller. The detecting means is configured to detect the storage state in the cache device. When the cache device is in a normal working state, the first blowing means keeps operation. When the idle time of the cache device exceeds a predetermined period of time, the detecting means sends a start signal to the controller; the controller controls the second blowing means and the exhaust means to start according to the start signal to operate the second blowing means and the exhaust means for the predetermined period of time.

Further, during operation of the second blowing means and the exhaust means, when detecting that a cached item is stored in the cache device, the detecting means sends a stop signal to the controller, which controls the second blowing means and the exhaust means to stop according to the stop signal.

Further, the cache device also comprises: an input unit, which is in signal connection with the controller, which controls the start and stop of the third blowing means according to the information input from the input unit.

One embodiment of the present disclosure also provides an LCD screen production line, on which the above mentioned cache device is disposed.

BRIEF DESCRIPTION OF THE DRAWINGS

The embodiments of the present disclosure will be further described below with reference to the drawings, in which.

DETAILED DESCRIPTION OF THE EMBODIMENTS

The typical structure of a current cache device basically comprises an outer frame, inside which a support bracket is arranged. The support bracket comprises a plurality of levels of horizontal cross beams, on each level of which a plurality of vertical support pins are densely arranged. A plurality of cached glass substrates can be horizontally supported on the support pin at different levels. The cache device is also supported by support seats on the bottom side, so that the cache device is at a height that allows an operator to pick and place glass substrates easily.

The outer frame of the cache device in related-arts is generally configured as a non-closed box, which is provided with an opening only on the front side (the operator-facing side) for picking and placing glass substrates, and the back wall (opposite to the opening), the left side wall (the side wall on the left side of the operator), the right side wall (the side wall on the right side of the operator), the top wall and the bottom wall of the outer frame each are detachably provided with a cover to define a relatively isolated space within the interior of the cache device for protecting the glass substrates.

In electronic glass deep-processing production line, the yield rate can be increased by improving product cleanness. In order to prevent glass substrates from being contaminated by particles, such as dust, during transition in the cache device, how to keep the environment in the cache device clean is very important for increasing the yield rate. Currently, the outer frame of cache device is equipped with an Equipment Fan-filter Unit (EFU) on the top wall and with a plurality of vents in the bottom wall. EFU blows filtered clean air from top to bottom inside the outer frame when the cache device is idle (no glass substrate being stored inside of the cache device), so that air stream thus generated is discharged from the vents in the bottom wall to clean the interior of the cache device.

However, limited cleaning effect can be brought by the above-mentioned cleaning means. On one hand, clean air can only be blown when the cache device is idle, and on the other hand, dust accumulates easily in corners that cannot be blown by the air stream to leave hard-to-clean corners. As a result, it is also necessary to make a deep cleaning for the cache device manually on Preventive Maintenance (PM) days from time to time. Because of dense arrangement of the horizontal cross beams and the support pins inside the outer frame as well as narrow maintenance space, a person cannot enter into the outer frame to wipe during manual cleaning, but has to remove side walls, then pass a cleaning tool through the interior of the outer frame, and perform "drag-saw" cleaning on two sides of the cache device, which is difficult, inefficient and produces poor cleaning effect.

Figure 1:
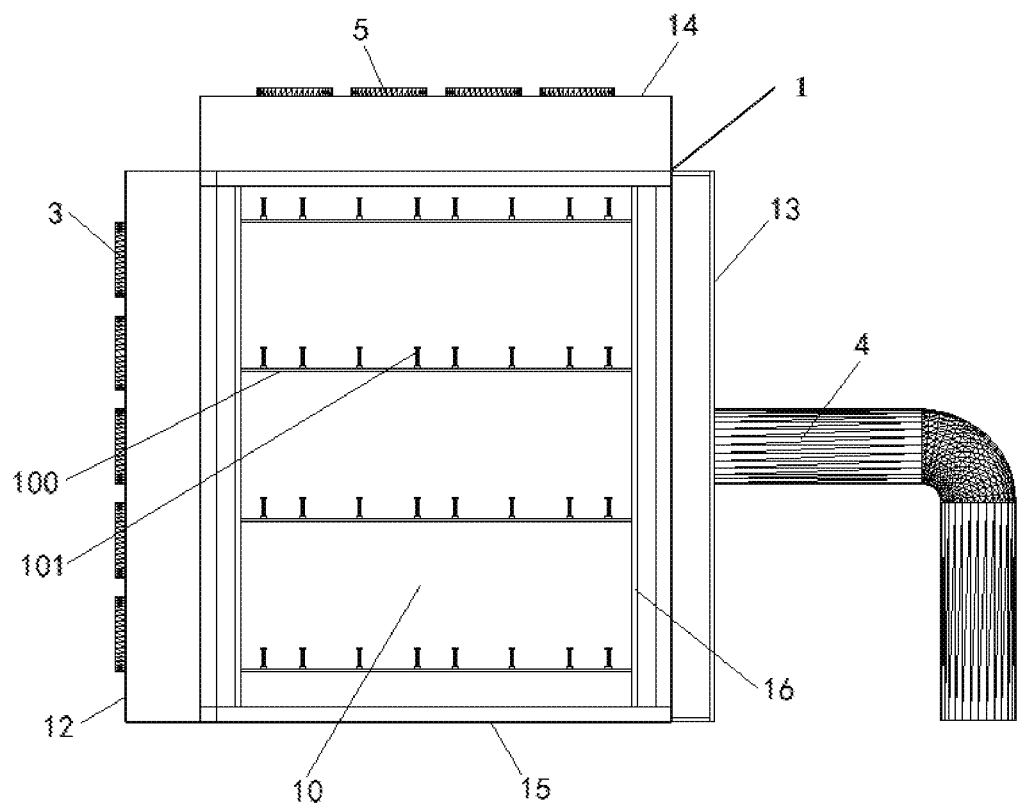
FIG. 1 shows a front view of the cache device according to an embodiment of the present disclosure.
Figure 2:
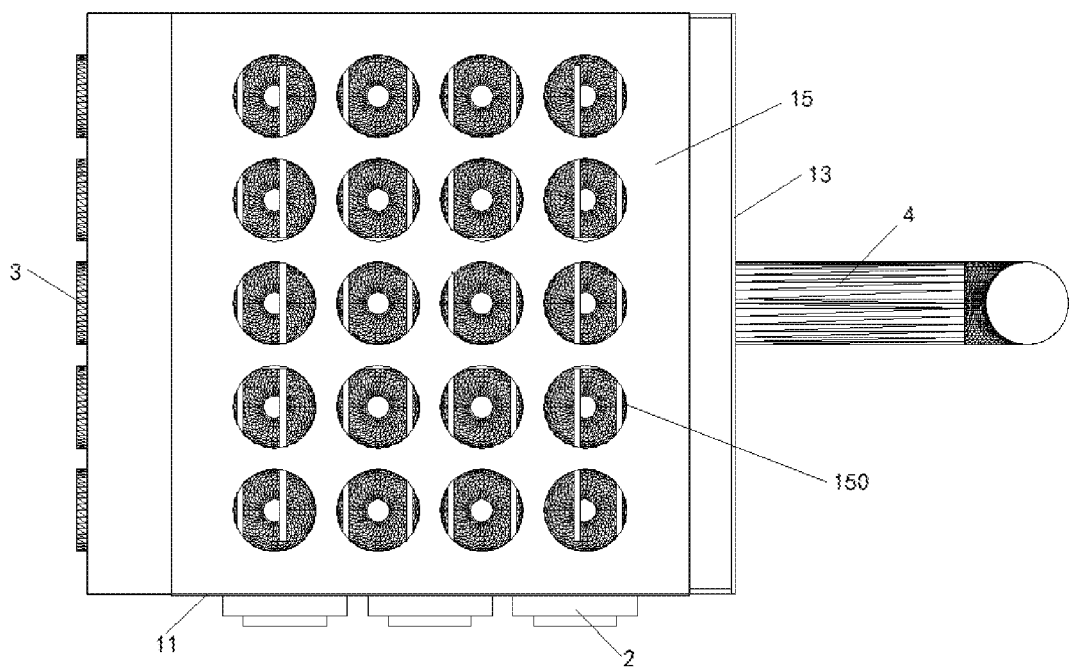
FIG. 2 shows a bottom view of the cache device according to the embodiment of the present disclosure.
Figure 3:
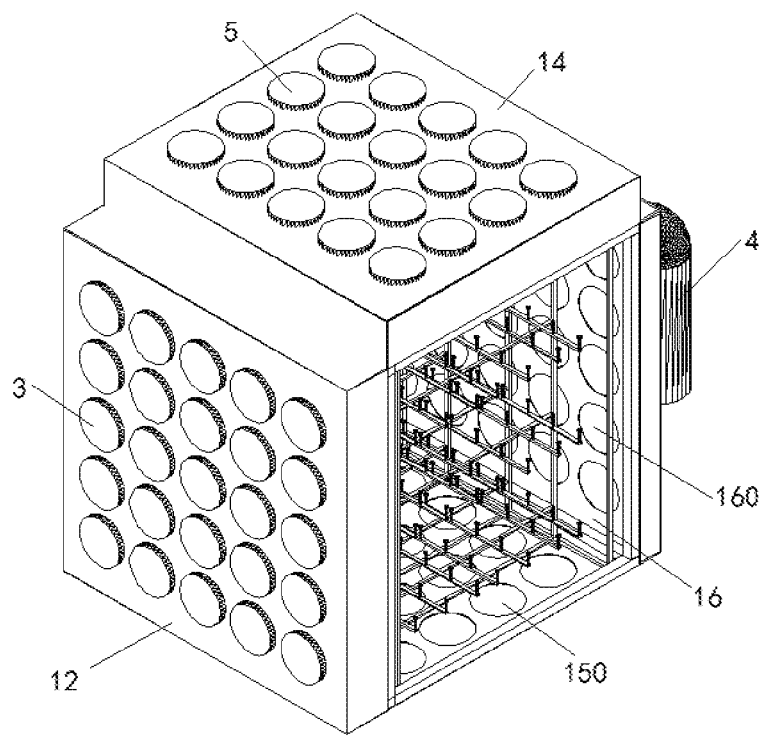
FIG. 3 shows a perspective view of the cache device in a first direction according to the embodiment of the present disclosure.
Figure 4:
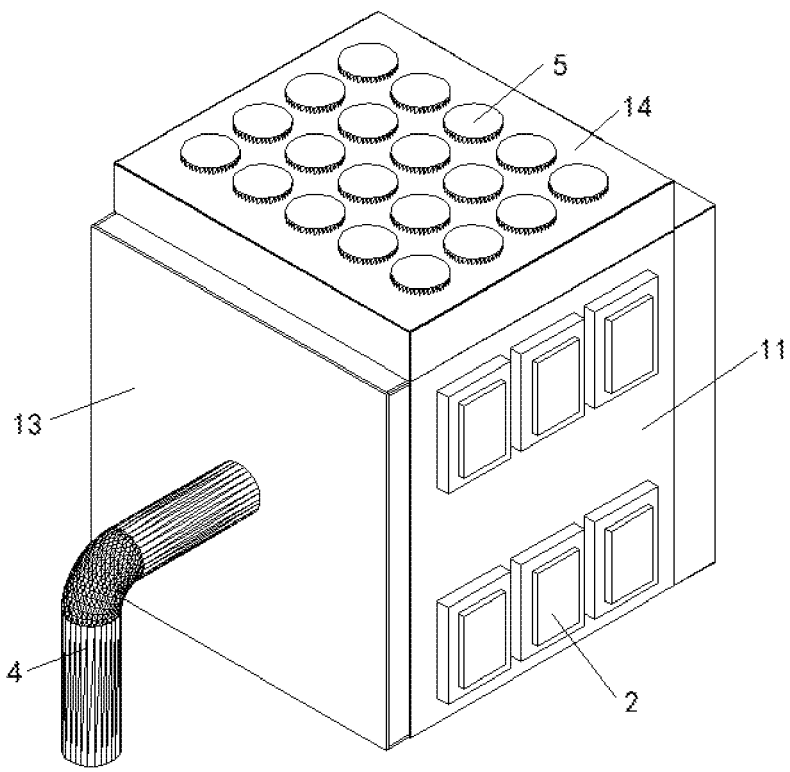
FIG. 4 shows a perspective view of the cache device in a second direction according to the embodiment of the present disclosure.

Referring to FIGS. 1-4, the structure of a cache device provided by an embodiment of the present disclosure is shown. The cache device is used for, e.g., supporting glass substrates. As shown in the figures, the cache device includes an outer frame 1, the structure which is substantially embodied as non-closed box, as can be found in related arts. A first side wall of the outer frame 1, such as the front side wall, has an opening 10 for picking and placing the cached items. A second side wall of the outer frame 1 opposite to the first side wall, such as the back wall 11, a third side wall 12 and a forth side wall which are opposed to each other, for example, the left side wall 12 and the right side wall 13, a fifth side wall and a sixth side wall which are opposed to each other, such as the top wall 14 and the bottom wall 15, are preferably detachably provided with a cover plate to define a relatively isolated space for protecting glass substrates.

A support bracket for horizontally supporting cached items (such as glass substrates) is arranged inside of the outer frame 1. Preferably, the support bracket comprises a plurality of levels of horizontal cross beams 100, on each level of which a plurality of vertical support pins 101 are densely arranged. The cached glass substrates can be horizontally supported on the support pins. The horizontal cross beams and the support pins thereon may be made of aluminum. The position where support pins are in contact with glass substrates may also be sheathed with a protective sleeve made of Peek (polyetheretherketone resin) to prevent glass substrates from being scratched by support pins. The body and the side walls of the outer frame 1 may be made of stainless steel. The cache device is also supported by a supporting seat (not shown) on the bottom side, so that the cache device is at a height that allows the operator to pick and place glass substrates conveniently.

The cache device provided in this embodiment further includes first blowing means 2, second air blowing means 3, and an exhaust duct 4. The first blowing means 2 is disposed on the back wall 11 of the outer frame 1, intended to blows air toward the opening 10, that is, the first blowing means 2 substantially blows air horizontally from the back wall 11 toward the opening 10. It can be understood that the air stream blown by the first blowing means 2 is a filtered clean air stream. Preferably, the first blowing means 2 may be a plurality of Equipment Fan-filters Units (hereinafter referred to as EFU) mounted on the back wall of the outer frame 1 and arranged in a rectangular array, and the air stream blown by the EFUs runs through the interior of the outer frame 1 substantially in a horizontal direction and then is discharged from the opening 10. Compared with the clean means in the related art in which EFUs are installed on the top wall to blow air downwards (when the cache device is not idle, carried dust particles cannot be blown away once fall on the glass substrates because the flow direction of the clean air stream is orthogonal to the glass substrate, and it is necessary to shut down the EFUs), basic cleaning of the cache device for 24 hours a day can be achieved without stopping the EFUs and being limited to the idle time of the cache device only, even when glass substrates are placed inside the cache device of this embodiment, because the blowing direction of the first blowing means 2 is substantially parallel to the plane for placing the glass substrates, thus improving daily cleaning effect. In addition, the air stream discharged from the opening does not exert negative affect on other products on both sides of the cache device in the (upstream and downstream) production line since the first blowing means 2 blows air toward the opening 10.

The second blowing means 3 is disposed on the left side wall 12 of the outer frame 1 for blowing clean air into the outer frame 1. It can be understood that the air stream blown by the second blowing means 3 should also be filtered clean air. The exhaust duct 4 is disposed on the right side wall 13 of the outer frame 1 and is adapted to communicate with the exhaust means for exhausting gas inside the outer frame 1 and mainly for exhausting clean gas blown by the second blowing means 3. Preferably, the blowing means may be a vacuum blowing device.

The second blowing means 3 may also employ EFUs to horizontally blow air from left to right. Or alternatively, the second blowing means 3 includes a plurality of nozzles adapted to communicate with a source of compressed dry air, and the plurality of nozzles arranged in a rectangular array on the left side wall. The source of compressed dry air preferably provides compressed dry air at 0.5 Mpa to 0.6 Mpa, so that the pressure of the air stream blown by the second blowing meaning 3 is not less than the pressure of the air stream blown by the first blowing means 2 to be more capable of cleaning. In this way, the direction of the air stream blown by the second air blowing means 3 is not parallel to the direction of the air stream blown by the first air blowing means 2, so that areas where the first blowing means 2 cannot blown can be cleaned additionally to realize deep cleaning. When the second blowing means 3 blows air, the air stream from the left side can be discharged by the exhaust means without providing vents on the right side wall 13 for air communication, which also avoids adverse effect on the product on the right side of the cache device in the product line caused by provision of vents communicating with the environment on the right side wall. It can be understood that in other embodiments, the positions of the second blowing means 3 and the exhaust duct 4 are interchangeable, which means that the second blowing means 3 may be disposed on the right side wall of the outer frame 1, and the exhaust duct 4 may be disposed on the left side wall thereof.

Preferably, each nozzle of the second blowing means 3 may be a 360° rotating nozzle to cover more cleaning angles and a larger cleaning range, and to further reduce blind areas. When each nozzle is a 360° rotating nozzle, in order to prevent clean air stream at high pressure from striking cached glass substrates when being blown obliquely upward or downward, the second blowing means 3 and the exhaust means can be activated when the cache device is idle in the normal working state.

Preferably, in order to allow the clean stream blown by the second blowing means 3 to be exhausted by the air exhaust means more easily, a vertical guide plate 16 may also be disposed inside the right side wall 13 on which the exhaust duct 4 is provided. The vertical guide plate 16 is arranged in parallel with the right side wall 13 and provided with a plurality of guide holes 160, so that the clean air blown by the second blowing means 3 may be exhausted by the exhaust means after being guided relatively uniformly into the exhaust duct 4, which facilitates uniform flow of clean air stream inside the cache device. Of course, in other embodiments, if the exhaust duct 4 is mounted on the left side wall 12, the vertical guide plate 16 is disposed approximate to the inner side of the left side wall 12 and in parallel with the left side wall 12.

In order to further enhance the cleaning effect, the cache device further comprises third blowing means 5 arranged on the top wall 14 of the outer frame 1 for blowing clean air to the interior of the outer frame 1. It can be understood that the air stream blown by the third blowing means 5 may also be filtered clean air. In order to exhaust the clean air blown by the third blowing means 5 smoothly, on the bottom wall 15 of the outer frame 1 a plurality of vents 150 are provided, which may have a larger inner diameter, and through which clean air flows to the lower part of the cache device, without affecting the product located on both sides of the cache device in the production line.

The third blowing means 5 may also be embodied as EFUs for blowing air from top to bottom. Or alternatively, the third blowing means 5 includes a plurality of nozzles adapted to be in communication with a source of compressed dry air and arranged in a rectangular array on the top wall 14. The third blowing means 5 may share the source of compressed dry air source with the second blowing means 3, or the pressure of the air stream blown by the third blowing means 5 may be not less than the pressure of the air steam blown by the second blowing means 3, for instance, the pressure of compressed dry air communicated with the third blowing means 5 ranging from 0.7 Mpa to 0.8 Mpa. In this way, the direction of the air stream blown by the third blowing means 5 is different from the direction of the air stream blown by the first air blowing means 2 and the second blowing means 3, so that the interior of the cache device can be cleaned more thoroughly.

Preferably, each nozzle of the third blowing means 5 may also be a 360° rotating nozzle. In addition, in order to achieve a balance between the cleaning effect and resource saving, the third blowing means 5 can be activated only on PM days.

In order to realize the automatic control of the cleaning operation of the cache device, preferably, the cache device further comprises detecting means and a controller. The detecting means may for example comprise a approach switch provided inside the cache device for detecting the storage state in the cache device. In the normal operation state of the cache device, the first blowing means 2 keeps running. When the idle time of the cache device exceeds a determined period of time (for example, 30 minutes), the detecting means sends a start signal to the controller, which in turn controls the second blowing means 3 and the exhaust means to start according to the start signal, so that the second blowing means 3 and the exhaust means are stopped after running for a predetermined period of time (for example, 30 minutes), realizing automatic start and stop of the second blowing means 3 and the exhaust means. Preferably, the controller may be a PLC controller.

In addition, when the second blowing means 3 and the exhaust means are in operation, the detection means sends a stop signal to the controller when detecting any cached item stored in the cache device. The controller controls the second blowing means and the exhaust means to stop according to the stop signal 3, preventing strong air stream blown by the second blowing means 3 from impacting the glass substrates.

Preferably, the cache device further comprises an input unit, which may also be connected with the controller, which controls the start and the stop of the third blowing means 5 according to the information input from the input unit that may be a touch screen. If PM day of the cache device is a fixed day, the automatic mode can be selected on the touch screen. According to the data pre-input in the program, the third blowing means 5 can start automatically on set PM day and stop automatically s after running for a certain period of time. If the PM day is not fixed, manual mode can be selected by clicking the start/stop button on the touch screen manually to realize a start/stop function of the third blowing means, or by clicking the start button in manual mode and stopping the third blowing means automatically after e.g., 4 hours.

To sum up, the cache device provided in this embodiment can provide two cleaning modes: a normal cleaning mode suitable for normal cleaning on normal production days, where the first blowing means 2 keeps running continuously and the second blowing means 3, and the exhaust means operate according to the storage state of the cache device; and a PM cleaning mode suitable for thorough cleaning on PM days, where the first blowing means 2, the second blowing means 3, the exhaust means, and the third blowing means 5 are all activated for a predetermined period of time.

Test shows that when the normal clean mode is performed on the normal production day of the cache device, the proportion of dust and particles removed is about 80%, whereas when cleaning is performed on PM days, the proportion of dust and particles removed is approximately 100%. However, current cache devices have a dust removal ratio of about 50% on the production day and about 70% on PM days. Therefore, the cache device provided in this embodiment not only reduces the difficulty in cleaning the interior space, but also improves the cleaning efficiency and cleaning effect.

In the cache device provided in the embodiment of the present disclosure, the first blowing means can substantially blow air horizontally from the second side wall of the outer frame to the opening. The blowing direction of the first blowing means is substantially parallel to the plane of the glass substrate(s). Even if a glass substrate (glass substrates) is placed inside the cache device, the first blowing means may not be stopped, so that the cache device is generally cleaned for 24 hours a day, which significantly improves daily cleaning of the cache device. The direction of the air stream blown by the second blowing means is not parallel to the direction of the air stream blown by the first blowing means, so that areas that the first blowing means cannot blow are cleaned additionally, when the cache device is idle, to achieve deep cleaning of the cache device, which can greatly reduce the frequency of manual cleaning with great cleaning effect.

An embodiment of the present disclosure further provides an LCD screen production line which is equipped with the cache device in the embodiment of the present disclosure, and therefore, which can produce the technical effect created by the cache device as illustrated above.

It may be understood that the above embodiments of the present disclosure are merely exemplary embodiments used for illustrating the principle of the present disclosure, but the disclosure is not limited thereto. For those skilled in the art, various modifications and improvements may be made without departing from the spirit and essence of the present disclosure, and are also deemed to be within the protection scope of the present disclosure. The scope of the present disclosure is defined only by the meaning of the language expressions of the appended claims and their equivalents.

What is claimed is:

1. A cache device, comprising:
   a frame, a first side wall of which has an opening for picking and placing cached items;
   a support bracket located in an area surrounded by the frame for supporting cached items;
   first blowing means on a second side wall opposite to the first side wall of the frame; the first blowing means being configured to blow air toward the opening;
   second blowing means on a third side wall of the frame adjacent to the first side wall; and
   exhaust means disposed on a fourth side wall opposite to the third side wall of the frame.

2. The cache device according to claim 1, further comprising: third air blowing means provided on a fifth side wall of the frame; at least one vent provided on a sixth side wall opposed to the fifth side wall.

3. The cache device according to claim 2, wherein the second blowing means is configured that the pressure of the air stream blown is not less than the pressure of the air stream blown by the first blowing means, and/or the third blowing means is configured that the pressure of the air stream blown is not less than the pressure of the air stream blown by the second blowing means.

4. The cache device according to claim 2, wherein the fourth side wall comprises a vertical guide plate, on which at least one guide hole is arranged.

5. The cache device according to claim 2, wherein,
   the first blowing means includes a plurality of EFUs arranged in a rectangular array; and/or,
   the second blowing means and the third blowing means each include a plurality of nozzles adapted to be in communication with a source of compressed dry air; and/or,
   the exhaust means is a vacuum exhaust means.

6. The cache device according to claim 5, wherein the nozzle is a 360° rotating nozzle.

7. The cache device according to claim 2, further comprising detecting means and a controller, wherein the detecting means is configured to detect a storage state in the cache device; and the first blowing means keeps operating when the cache device is in normal working state; the detecting means sends a start signal to the controller when the idle time of the cache device exceeds a predetermined period of time; and the controller controls the second blowing means and the exhaust means to start according to the start signal, allowing the second blowing means and the exhaust means to operate for a predetermined period of time.

8. The cache device according to claim 7, wherein during the operation of the second blowing means and the exhaust means, the detecting means, when detecting that a cache item is stored in the cache device, sends a stop signal to the controller, which in turn controls the second blowing means and the exhaust means to stop according to the stop signal.

9. The cache device according to claim 7, further comprising: an input unit which is in signal connection with the controller, which controls the start and stop of the third blowing means according to the information input from the input unit.

10. A liquid crystal display screen production line equipped with the cache device according to claim 1.

* * * * *